US006900878B2

(12) United States Patent
Okubo et al.

(10) Patent No.: US 6,900,878 B2
(45) Date of Patent: May 31, 2005

(54) RETICLE-HOLDING PODS AND METHODS FOR HOLDING THIN, CIRCULAR RETICLES, AND RETICLE-HANDLING SYSTEMS UTILIZING SAME

(75) Inventors: Yukiharu Okubo, Kumagaya (JP); Hidekazu Kikuchi, Miyagi-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/635,803

(22) Filed: Aug. 5, 2003

(65) Prior Publication Data

US 2004/0057030 A1 Mar. 25, 2004

(30) Foreign Application Priority Data

Aug. 5, 2002 (JP) ..................................... 2002-226926

(51) Int. Cl.[7] .............................................. G03B 27/42
(52) U.S. Cl. ..................... 355/53; 206/710; 206/723; 414/217.1; 414/416.01; 414/931; 414/937
(58) Field of Search ........................... 355/53; 206/710, 206/723; 414/217.1, 931, 937, 416.01, 935, 940; 430/5, 31; 118/52, 319

(56) References Cited

FOREIGN PATENT DOCUMENTS

| JP | 3-157918 | * | 7/1991 |
| JP | 2002-252164 | * | 9/2002 |

* cited by examiner

Primary Examiner—D. Rutledge
(74) Attorney, Agent, or Firm—Klarquist Sparkman, LLP

(57) ABSTRACT

Reticle-holding devices (reticle "pods") are disclosed for holding circular reticles as used microlithography systems that use circular reticles. An exemplary reticle pod includes a base and cover. Mounted to the base are multiple (desirably three) reticle-support blocks providing three respective, equally spaced, reticle-contact surfaces that support a reticle in the peripheral "handling zone" of the reticle. Mounted to the inside surface of the cover are corresponding compliant pressure-application members (desirably respective flat springs terminating with respective reticle-contact members) that apply a holding force to the reticle. A respective portion of the reticle is situated between each pressure-application member and a respective reticle-support surface. Thus, the reticle, configured as a SEMI standard wafer, is stably held at three points in the handling zone of the reticle without damaging the reticle.

35 Claims, 6 Drawing Sheets

RETICLE-HOLDING PODS AND METHODS FOR HOLDING THIN, CIRCULAR RETICLES, AND RETICLE-HANDLING SYSTEMS UTILIZING SAME

FIELD

This disclosure pertains to microlithography, which is a key technique used in the manufacture of microelectronic devices such as integrated circuits, memories, displays, micromachines, and the like. The specific microlithography technology involves projection of a pattern, defined on a reticle or mask (termed "reticle" herein), from the reticle to a lithographic substrate coated with an exposure-sensitive resist. More specifically, the disclosure pertains to devices and methods for containing and holding a reticle for use in a microlithography system or other system configured to use or manipulate a reticle. The subject reticle-holding devices can be used for holding circular reticles, such as used in charged-particle-beam microlithography, and thus represent a substantial improvement over conventional reticle "pods" that are capable only of holding only rectilinear (square or rectangular) reticles.

BACKGROUND

The typical conventional reticle-holding devices (also termed reticle "pods") are configured for holding one or more square, glass reticles each having side dimensions of, e.g., 152.4 mm (6 inches) and a thickness of several mm. Most of these conventional reticle pods have certain features that have been standardized in the industry by Semiconductor Equipment and Materials International (SEMI) for automated use with various types of wafer-fabrication equipment. Thus, these conventional reticle pods are termed reticle "SMIF" (Standard Mechanical Interface) pods, abbreviated "RSPs" in the industry. Conventional RSPs are configured for use with "optical" (deep ultraviolet) microlithography systems, which are the "workhorse" microlithography systems currently in use.

A plan view of a conventional RSP 80 is shown in FIG. 10. The depicted RSP 80 is configured to hold a single square reticle R. (Other types of conventional RSPs are configured to hold multiple reticles.) The plan profile of the RSP 80 is roughly square. The RSP 80 comprises a base 81 and a cover (door) 83. When closed relative to the base 81, the cover 83 is secured in a sealing manner to the base 81 by a standardized door-latch mechanism (not shown, but well understood in the art). The door-latch mechanism is openable using a SEMI-standardized latch-opening mechanism that can be provided on any of various systems that use or manipulate the reticle and/or the RSP. Whenever the cover 83 is secured to the base 81 in this manner, an isolated space is formed between the base 81 and the cover 83. Thus, a reticle R contained within this space is isolated from the external environment, especially from environmental particulate contamination.

Attached to the base 81 at each of the four corners of the upper surface of the base are respective reticle-receiving pads 85. Each reticle-receiving pad 85 has a substantially oval-shaped plan profile that longitudinally extends toward the center of the base 81 and presents a respective "upward"-facing reticle-contact surface. The reticle R is placed in the RSP 80 such that the four corners of the square reticle R are supported on respective reticle-receiving pads 85, as shown. For mounting purposes, the reticle R typically has a generously wide non-patterned periphery that includes the four corners of the reticle. To secure the reticle R to the base 81, each respective corner of the reticle is urged against the respective receiving pad 85 by a respective presser member (not shown) mounted to a corresponding location on the inside ("lower") surface of the cover 83. To prevent entry of debris from the external environment into the RSP 80 while allowing pressure equalization, at least one filter 87 is provided at respective corner(s) of the base 81.

By thus holding the reticle R (usually chrome-side down) within a closed space, the conventional RSP 80 of FIG. 10 effectively isolates the reticle from contaminant debris and the like that may be present in the external environment. This isolation is especially important as the reticle is being moved from one location to another in a fabrication facility or during reticle storage for later use. As noted above, the door-latch mechanism that secures the cover 83 to the base 81 is standardized in conventional RSPs 80, allowing any of various apparatus that manipulate the RSP to open the RSP to gain access to the reticle inside.

In recent years, substantial engineering effort has been directed to the development of a practical "next-generation" microlithography system that offers prospects of producing finer pattern-transfer resolution than currently obtainable using optical microlithography. One attractive next-generation lithography (NGL) approach involves the use of a charged particle beam, such as an electron beam or ion beam, as the lithographic-energy beam. A key challenge in the development of a practical electron-beam microlithography system is configuring the system to produce the desired fine-ness of pattern-transfer resolution without sacrificing "throughput" (number of units, such as semiconductor wafers, that can be lithographically exposed by the system per unit time).

In an electron-beam (EB) microlithography system, the square, glass reticle conventionally used for optical microlithography is not used. Instead, the reticle typically is round (e.g., 200 mm in diameter) and much thinner (e.g., 0.5 to 1.0 mm) than an optical-lithography reticle. The typical shape of the EB-lithography reticle is that of a SEMI standard wafer or SEMI standard notched wafer. Almost the entire surface of the EB-lithography reticle is patterned. Since the entire pattern cannot be exposed in a single exposure "shot," the EB lithography reticle is divided into multiple "exposure units" (usually termed "subfields") each defining a respective portion of the pattern. The subfields are individually exposed. During exposure an electron beam is irradiated, from above, onto a selected subfield of the reticle.

Portions of the reticle that define pattern features and that actually are irradiated by the electron beam are very thin and delicate. Consequently, these portions of the reticle must not contact any other surfaces (such as a surface of a reticle pod). Rather, the reticle must be handled and supported only by its non-patterned (and more robust) peripheral "handling zone." The handling zone of an EB-lithography reticle typically is narrow, with a maximum usable "handling" width of several mm. Either or both the "upper" and "lower" surfaces of the handling zone can contact other surfaces such as of the reticle pod.

Since conventional reticle pods, such as the RSP 80 shown in FIG. 10, are configured for holding relatively thick, square reticles for use in optical microlithography, these pods are not suitable for holding thin, round, EB-lithography reticles having a narrow peripheral "handling" width of only several mm.

SUMMARY

The shortcomings of the prior art, summarized above, are addressed by various aspects of the present invention.

According to a first aspect of the invention, reticle pods are provided for holding a circular reticle. An embodiment of such a pod comprises a base and a cover. The base has a respective interior surface, and the cover has a respective interior surface. The cover is attached to the base in a manner allowing the cover to open and close relative to the base and to define, cooperatively with the base whenever the cover is closed, an internal space between the respective interior surfaces. The internal space is sized to accommodate the reticle within the internal space. The pod also comprises three reticle-support blocks mounted to the interior surface of the base. The reticle-support blocks are arranged substantially equi-distantly from each other so as to support the reticle at three respective locations in a tripod manner in a peripheral handling zone on an under-surface of the reticle. Each reticle-support block defines a respective reticle-contact surface that contacts the respective location in the handling zone whenever the reticle has been placed on the reticle-support blocks. The pod also comprises three compliant reticle-contact members mounted to the interior surface of the cover so as to be positioned, whenever the cover is closed, opposite a respective reticle-contact surface on an upper surface of the reticle. Each reticle-contact member is non-adhesive and configured to apply, whenever the cover is closed, a reticle-holding force directed from the reticle-contact member to the respective reticle-contact surface.

Each reticle-contact member desirably is mounted to a respective pressure-application member mounted to a respective mounting location on the interior surface of the cover. For flexibility in positioning the reticle-contact members relative to the reticle, the cover desirably defines more than three mounting locations, wherein the three pressure-application members are mounted to respective mounting locations among the more than three mounting locations provided on the cover. Further desirably, each pressure-application member comprises a flat spring having a proximal end mounted to the respective mounting location on the interior surface of the cover and a distal end to which the respective reticle-contact member is mounted. Each flat spring desirably is triangular in profile, with a short side and two long sides. In this configuration the short side is on the proximal end of the flat spring, and the respective reticle-contact members are mounted to an intersection of the two long sides. Each flat spring can have a different size and shape, wherein each flat spring desirably applies a similar magnitude of reticle-holding force, via the respective reticle-contact members, to the respective locations in the handling zone. Further desirably, the reticle-holding forces are normal in direction to the respective reticle-contact surfaces.

The pod further can comprise a toroidal ring-shaped member mounted to the interior surface of the base, wherein the reticle-support blocks are mounted to the ring-shaped member. In this configuration the reticle-support blocks desirably are equi-angularly arranged on the ring-shaped member. This configuration further can comprise at least three mounting pads situated between the ring-shaped member and the interior surface of the base, wherein the mounting pads are mounted to the interior surface of the base and the ring-shaped member is mounted to the mounting pads. The mounting pads desirably are configured to align the ring-shaped member with the base.

The reticle-support blocks desirably are arranged so as not to interfere with a sensor used for determining whether a reticle is contained inside the reticle pod.

The pod further can comprise a reticle aligner situated and configured to align the reticle with respect to the pod whenever the reticle is contained in the pod. The reticle aligner can comprise a protrusion defined in one of the reticle-support blocks. The protrusion is situated and configured to engage an edge notch in the reticle whenever the reticle is being held in the pod. For example, the protrusion can be configured to engage a SEMI-standard edge notch.

At least two of the reticle-support blocks can include, on their respective reticle-contact surfaces, respective stop pins situated and configured to engage an edge of the reticle whenever the reticle is being held in the pod. Two of the reticle-support blocks can include respective stop pins, wherein a third reticle-support block defines a protrusion as summarized above.

In general, the pressure-application members can be, for example, spring members or elastomeric members. For example, each reticle-contact member can comprise a respective O-ring that edgewise contacts the respective location in the handling zone. O-rings used in this manner are replaceable, which facilitates effective maintenance of the pods.

A pod according to another embodiment comprises a base and a cover. The base and cover have respective interior surfaces. The cover is attached to the base in a manner allowing the cover to open and close relative to the base and to define, cooperatively with the base whenever the cover is closed, an internal space between the respective interior surfaces. The internal space is sized to accommodate the circular reticle within the internal space. The pod also includes three reticle-support blocks mounted to the interior surface of the base. The reticle-support blocks are arranged substantially equi-distantly from each other so as to support the reticle at three respective locations in a tripod manner in a peripheral handling zone on an under-surface of the reticle. Each reticle-support block defines a respective reticle-contact surface that contacts the respective location in the handling zone whenever the reticle has been placed on the reticle-support blocks, wherein at least one of the reticle-support blocks comprises a reticle aligner configured to align the reticle with respect to the pod whenever the reticle is contained in the pod.

The reticle aligner can comprise a protrusion defined in one of the reticle-support blocks, wherein the protrusion is situated and configured to engage an edge notch in the reticle whenever the reticle is being held in the pod. For example, the protrusion can be configured to engage a SEMI-standard edge notch.

At least two of the reticle-support blocks can include, on their respective reticle-contact surfaces, respective stop pins situated and configured to engage an edge of the reticle whenever the reticle is being held in the pod. In a particular configuration, two of the reticle-support blocks include respective stop pins and a third reticle-support block defines a protrusion. The protrusion is situated and configured to engage an edge notch in the reticle whenever the reticle is being held in the pod.

According to another aspect of the invention, methods are provided for holding a circular reticle having an upper surface, a lower surface, and a peripheral handling zone extending around at least a portion of the circumference of the reticle. In an embodiment of such a method the reticle is supported, on respective reticle-contact surfaces, at three locations in the handling zone on the lower surface of the reticle. The locations are substantially equal distances from one another. Another step involves compliantly imparting, in respective directions normal to the respective reticle-contact surfaces, respective reticle-holding forces at respective locations in the handling zone on the upper surface of the reticle.

This method further can include the step of establishing and maintaining an alignment of the reticle as the reticle is being held. This step can comprise engaging a protrusion into an edge notch in the reticle.

The reticle-holding forces desirably are equal in magnitude, and the reticle-holding forces desirably are parallel to each other.

The method further can comprise the step of containing the reticle, as the reticle is being held on the reticle-contact surfaces, in a reticle pod serving to isolate the reticle from an external environment. This method further can comprise the step of configuring the reticle pod with a base and a cover, wherein the cover is openable relative to the base. This method further can comprise the step of aligning the reticle-contact surfaces relative to the base.

According to yet another aspect of the invention, microlithography systems are provided that comprise: (i) an optical column configured to receive a circular reticle, and (ii) a reticle pod having any of the configurations summarized above.

Thus, this invention provides, inter alia, reticle pods that are especially appropriate for reticles for electron-beam (EB) microlithographic exposure. In this regard, the reticle pods disclosed herein represent substantial improvements to commercially available reticle pods.

The foregoing and additional features and advantages of the invention will be more readily apparent from the following detailed description, which proceeds with reference to the accompanying drawings.

BRIEF DESCRIPTION OF THE DRAWINGS

FIG. 3 is a plan view of a portion of the base shown in FIG. 2, wherein FIG. 3 shows details of a reticle-support block.

DETAILED DESCRIPTION

The invention is described below in the context of representative embodiments that are not intended to be limiting in any way.

In the following description directed to a "reticle" held in a reticle-holding device, it will be understood that the "reticle" can be an actual patterned reticle (i.e., a reticle on which a pattern has been defined) or a "reticle blank," on which a pattern has not yet been defined.

Figure 1:
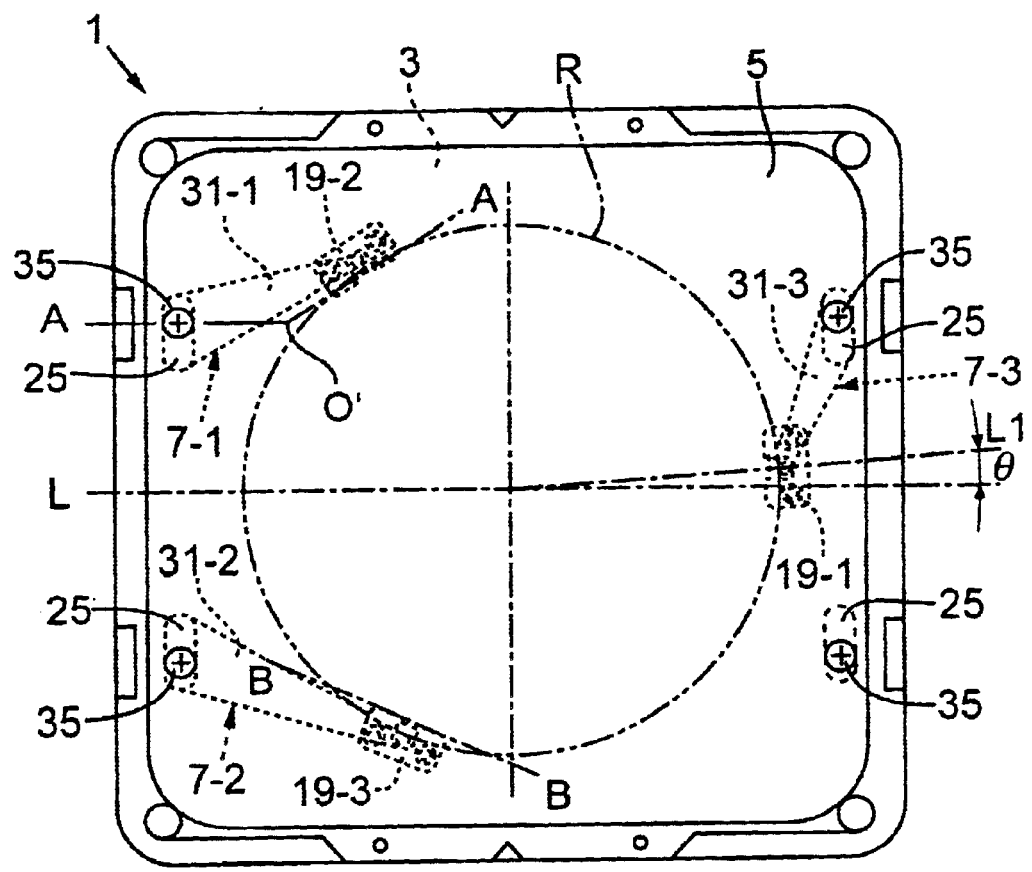
FIG. 1 is a plan view of a reticle-holding device (reticle "pod") according to a first representative embodiment.
Figure 2:
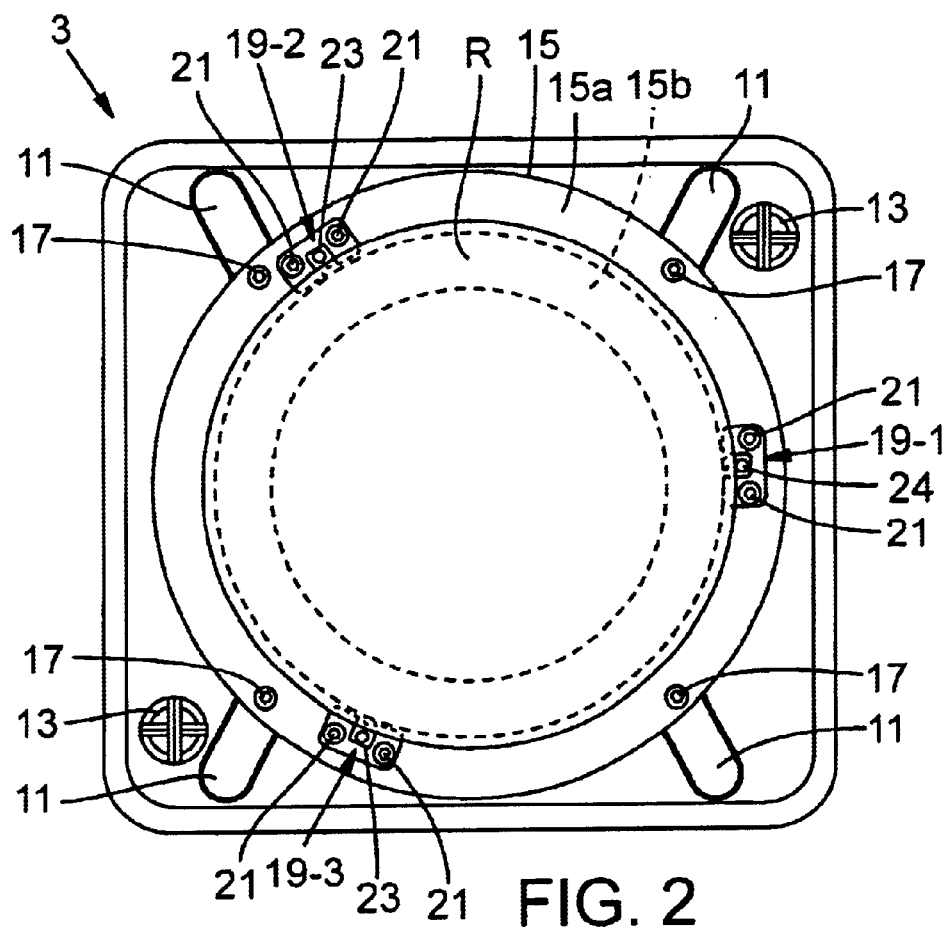
FIG. 2 is a plan view of the base of the reticle pod of FIG. 1.
Figure 3:
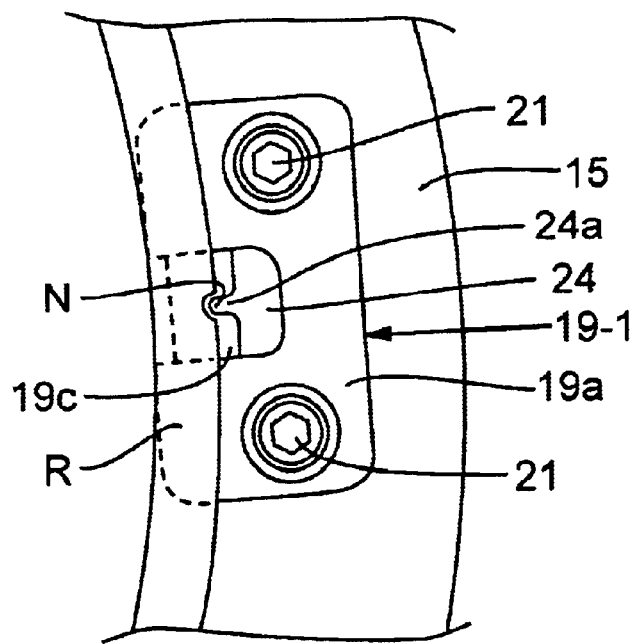
Figure 4A:
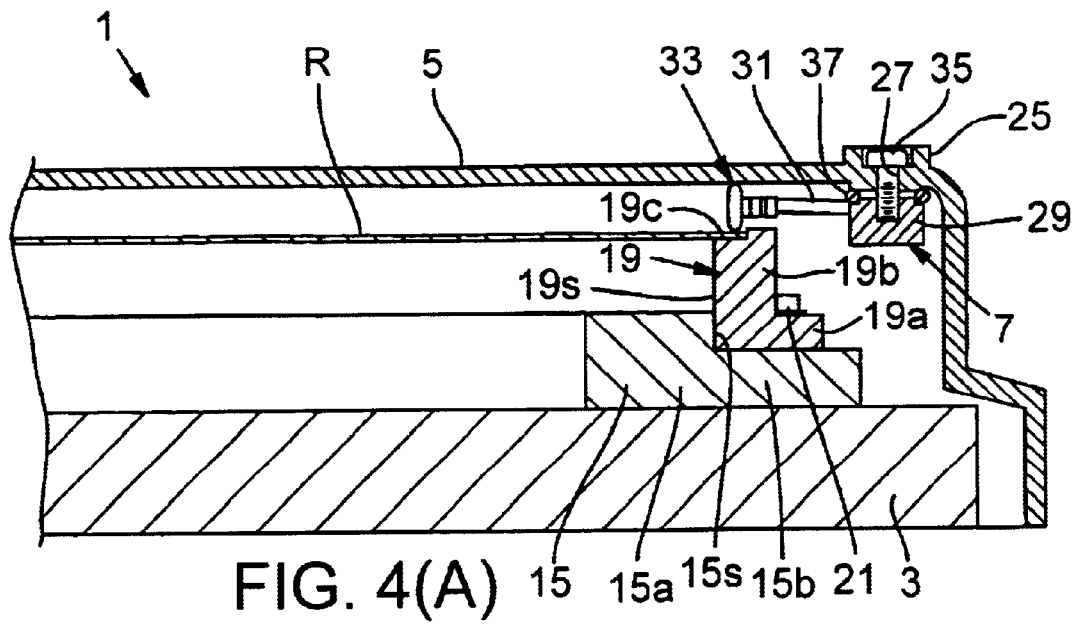
FIG. 4(A) is an enlarged partial elevational section, along the line A—A in FIG. 1, showing details of the ring-shaped member, a reticle-support block, a pressure-application member, the cover, and the base of the first representative embodiment.
Figure 4B:
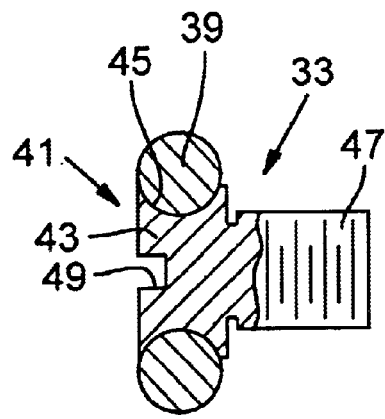
FIG. 4(B) is an enlargement showing details of the reticle-contact member provided on the distal end of the pressure-application member shown in FIG. 4(A).
Figure 5:
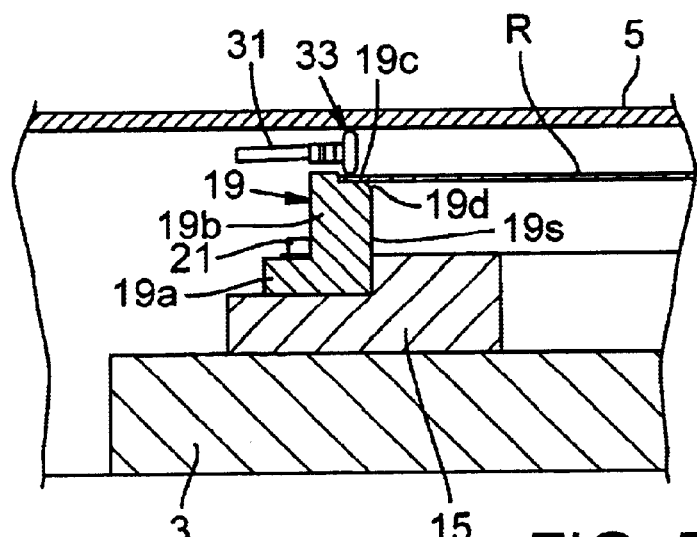
FIG. 5 is an enlarged partial elevational section along the line B—B of FIG. 1.

A first representative embodiment of a reticle-holding device ("reticle pod") 1 is depicted in FIGS. 1–3, 4(A)–4(B), and 5. FIG. 1 is a plan view of the reticle pod, FIG. 2 is a plan view of the base of the reticle pod 1, FIG. 3 is an enlarged plan view of a portion of the base, FIG. 4(A) is cross-sectional view along the line A-O'-A of the reticle pod 1 of FIG. 1, FIG. 4(B) is an enlarged section of a portion of FIG. 4(A), and FIG. 5 is a cross-sectional view along the line B—B of the reticle pod 1 of FIG. 1.

Figure 10:
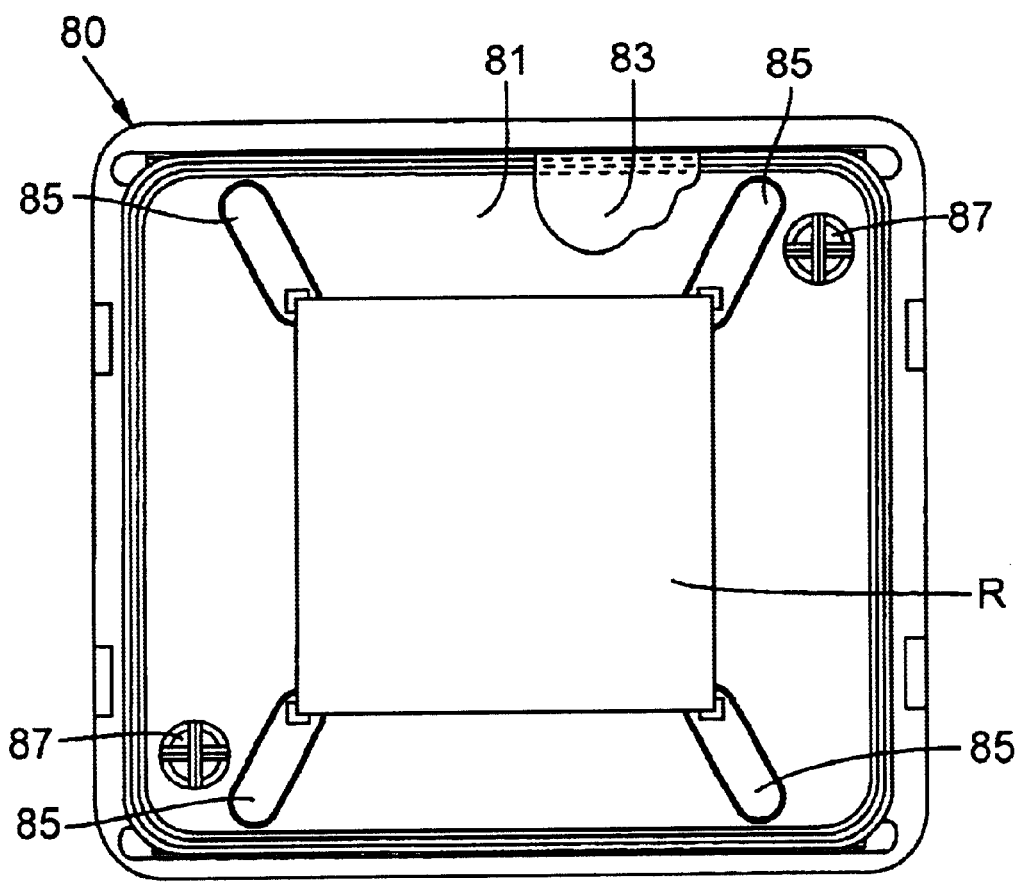
FIG. 10 is plan view of a conventional reticle pod.

The reticle pod 1 comprises a base 3 and a cover 5. In the same manner as the conventional RSP 80 of FIG. 10, the cover 5 is secured to the base 3 in a sealing manner, desirably by a SEMI-standard door-latch mechanism (not shown). Thus, whenever the cover 5 is attached to the base 3, an isolated space (in which the reticle R is held) is formed between the "upper" surface of the base 3 and the "lower" surface of the cover 5.

Attached to the "lower" surface of the cover 5 are three pressure-application members 7-1, 7-2, 7-3 configured to apply a respective local holding pressure to the reticle R whenever the reticle is being held in the reticle pod 1. Attached to the "upper" surface of the base 3 are three corresponding reticle-support blocks 19-1, 19-2, 19-3. Whenever the reticle R is being held in the reticle pod 1, respective locations in the peripheral "handling zone" of the reticle are secured between a respective pressure-application member 7 and a respective reticle-support block 19, thereby holding the reticle R securely in the reticle pod. This manner of holding the reticle R is discussed in detail later below.

Certain details of the base 3 of the reticle pod 1 are shown in FIG. 2. The base 3 shares certain similarities with the base of the conventional RSP of FIG. 10. For example, the base 3 comprises at least three (four are shown) mounting pads 11 arranged at the four respective corners on the "upper" surface of the base 3. The mounting pads 11, similarly to a conventional reticle pod (FIG. 10), are roughly oval in profile and extend toward the center of the base 3. To prevent incursion of airborne debris from the external environment into the reticle pod 1, one or more filters 13 are provided, e.g., at each of two diagonally opposed corners of the base 3.

Mounted to the "upper" surfaces of the mounting pads 11 is a toroidal ring-shaped member 15. The ring-shaped member 15 is secured to the mounting pads 11 by respective machine screws 17 or analogous fasteners. The manner of positioning and securing the ring-shaped member 15 to the mounting pads 11 is discussed later below.

Turning now to FIG. 4(A), the ring-shaped member 15 in transverse section comprises an "inner" thicker portion 15a and an "outer" thinner portion 15b. Each portion 15a, 15b is fully circumferential. The reticle-support blocks 19-1, 19-2, 19-3 are secured by respective machine screws 21 (or analogous fasteners) to three respective locations on the thinner portion 15b. The reticle-support blocks 19 desirably are arranged substantially equi-angularly around the ring-shaped member 15. In FIG. 1 note that none of the reticle-support blocks 19 is situated on a "horizontal" center line L of the pod base 3, as discussed in detail later below.

Each reticle-support block 19 comprises a respective base 19a and respective riser 19b extending "upwardly" from the base 19a. The bases 19a are mounted at respective locations on the thinner portion 15b of the ring-shaped member 15. Note that, with respect to each reticle-support block 19, the inwardly facing surface 19s contacts the outwardly facing surface 15s of the thicker portion 15a. Thus, the reticle-support blocks are positioned circumferentially at equally spaced intervals around the circumference of the ring-shaped member 15 and equally distant from the axis of the ring-shaped member. Each base 19a is fastened to the thinner portion 15b by two machine screws 21 or analogous fasteners. The riser 19b of each reticle-support block 19 has a respective "upper" surface 19c serving as a reticle-contact surface, wherein all the reticle-contact surfaces 19c are at the same elevation and are coplanar. When placed in the pod 1, the reticle R is placed on the reticle-contact surfaces 19c. As shown in FIG. 5, a chamfer 19d or analogous edge relief (to protect against accidental damage to the reticle R) is defined along the inner edge of each reticle-contact surface 19c.

Turning now to FIG. 2, the reticle-support block 19-1 of this embodiment is configured slightly differently than the reticle-support blocks 19-2, 19-3. Shown more clearly in FIG. 5, the reticle-support blocks 19-2, 19-3 each include a stop pin 23 secured to the reticle-contact surface 19c near the edge opposite the chamfer 19d. The reticle-support block 19-1, on the other hand (and as shown in FIG. 3), includes a notch-engagement portion 24 extending "upward" from the reticle-contact surface 19c. The notch-engagement portion 24 defines a protrusion 24a extending toward the axis of the ring-shaped member 15. The protrusion 24a is situated and configured to engage an edge notch N defined in the circumferential edge of the reticle R in the event the reticle R is made from a SEMI-standard notched wafer. The protrusion 24a inserted into the notch N in a mounted reticle R ensures a desired orientation of the reticle as the reticle is being held in the pod 1.

As a result of being provided on respective reticle-support blocks 19, the stop pins 23 and the notch-engagement portion 24 are situated at respective locations adjacent the outer edge of the reticle R as the reticle is being held by the pod 1.

Referring now to the cover 5, as shown in FIG. 1, the three pressure-application members 7-1, 7-2, 7-3 are attached to the "inner" surface of the cover 5. In this embodiment four possible mounting locations 25 are provided for attachment of the pressure-application members 7: two mounting locations at left in FIG. 1, and two mounting locations at right in FIG. 1. Only three mounting locations 25 (one for each pressure-application member) typically are used in a particular pod 1. As shown in FIG. 4(A), the mounting locations 25 are formed more thickly than other portions of the cover for extra strength and rigidity. Each mounting location 25 includes a respective screw hole 27 for mounting, as applicable, a respective pressure-application member 7.

In general, each pressure-application member can have any of various configurations suitable for applying reticle-holding pressure to the reticle R as the reticle is being held in the pod 1. By way of example, the pressure-application members can be springs (e.g., flat springs, rod-shaped springs, coil springs, or springs having any of various other suitable configurations) made of intrinsically non-compliant materials (e.g., metals, rigid plastics, and rigid cured-resin materials such as epoxies) configured to have springiness, or elastomeric members (e.g., blocks, rods, rings, or other suitable configurations made of rubber or analogous material) configured to exhibit springiness.

Referring further to FIG. 4(A), each pressure-application member 7 in the depicted embodiment comprises a base portion 29, a flat spring 31 of which a proximal end is mounted to the base portion 29 so that the flat spring 31 extends from the base portion 29 in a cantilever manner, and a reticle-contact member 33 attached to the distal end of the flat spring 31. The base portion 29 is secured to the "lower" surface of a respective mounting location 25 by a screw 35 or analogous fastener extending through the respective screw hole 27. An O-ring 37 is interposed between the "upper" surface of the base portion 29 and the "lower" surface of the mounting location 25 to provide a seal against debris that otherwise could enter the pod 1 through a gap between the screw 35 and the wall of the screw hole 27.

Each flat spring 31 is thin, with an elongated (desirably triangular) profile including a short side and two long sides. The short side is secured to the base portion 29. The intersection of the two long sides is the distal end of the flat spring 31, to which distal end a respective reticle-contact member 33 is attached. As detailed in FIG. 4(B), the reticle-contact member 33 comprises an O-ring 39 and a small screw 41 or analogous fastener. The screw 41 includes a head 43, around the periphery of which is defined an O-ring gland 45 having a nearly semicircular transverse depth profile. The O-ring 39 is mounted into the gland 45 and thus edgewise contacts the respective location in the handling zone of the reticle. The O-ring 39 desirably is made of an elastomeric material that does not produce particulate debris and that does not have excessive stickiness. Thus, the O-ring contacts the surface in the handling zone of the reticle R without adhering to the surface. The screw 41 includes a male threaded portion 47 that is threaded into the distal end of the flat spring 31. The head 43 of the screw 41 also includes a driver groove 49 or the like into which a driver (or analogous tool, not shown) is inserted as required for assembly or adjustment of the screw 41. By way of example, the O-ring 39 has an outer diameter of approximately 6.1 mm, and an inner diameter of approximately 2.6 mm.

The flat springs 31 of the respective pressure-application members 7-1, 7-2, 7-3 are not necessarily the same size and/or shape. In the depicted configuration (FIG. 1), the respective short sides of the flat springs 31 are equal in length, but the lengths of the long sides are different. For example, the flat spring 31-2 of the pressure-application member 7-2 is the longest of the three, and the flat spring 31-3 is the shortest of the three. The "length" of a flat spring 31, which is the distance from the respective mounting location 25 to the distal end of the flat spring, is selected so that the respective reticle-contact member 33 on the distal end of the flat spring is situated at the center of the respective reticle-contact surface 19c of the respective reticle-support block 19. Reflective of these differences in flat-spring length, the thickness of each flat spring 31 is selected independently so that, despite their differing lengths, each flat spring 31 applies the same force (1N, for example) to the respective reticle-contact member 33. As a result of this application of force to the reticle R by the flat springs 31, the respective O-ring 39 of each reticle-contact member 33 imparts a reticle-holding force in a normal direction directly toward the respective reticle-contact surface 19c.

The reticle pod 1 is used in the following exemplary manner. To insert the reticle R into the pod, the cover 5 is opened, and the reticle R is placed on the reticle-contact surfaces 19c of the reticle-support blocks 19. If the reticle R is made from a SEMI-standard notched reticle, as the reticle is being placed on the reticle-support blocks 19, the reticle R is oriented such that the protrusion 24a provided on the reticle-support block 19-1 is inserted into the notch N in the edge of the reticle R. Thus, the reticle R is oriented with respect to the pod 1. Since the reticle-support blocks 19-1, 19-2, 19-3 are mounted on the ring-shaped member 15, they are situated so that each upper surface 19c contacts a non-patterned region of the reticle (i.e., a respective location in the handling zone of the reticle), thereby avoiding contact and consequential damage to patterned regions of the reticle. Also, since the edge of the reticle R contacts the stop pins 23 on the reticle-support blocks 19-2, 19-3, the reticle is prevented from being misaligned horizontally.

After positioning the reticle R on the reticle-contact surfaces 19c as described above, the cover 5 is closed, which causes the respective reticle-contact member 33 on each pressure-application member 7 to contact a respective point on the "upper" surface of the periphery of the reticle R. By action of the flat springs 31, the respective O-ring 39 of each reticle-contact member 33 applies a reticle-holding force in a normal direction at the respective location in the handling zone as the reticle R is sandwiched between the reticle-contact surfaces 19c and the reticle-contact members 33. Since the O-rings 39 are compliant, they do not damage the surface of the reticle R. Damage and undue bending of the reticle R also are avoided by appropriate specification of the spring forces applied thereto by the flat springs 31. After the reticle R is supported between the base 3 and the cover 5 of the pod 1 in this manner, the cover 5 is secured to the base 3 using the SEMI-standard door-latch mechanism.

During removal of the reticle R from the pod 1, as the cover 5 is opened, the pressure-application members 7 are simultaneously moved away from the base 3, thereby withdrawing of the O-rings 39 of the reticle-contact members 33 from the reticle surface. Since the O-rings 39 are made from a non-sticky material, the reticle R does not stick to the O-rings 39, which avoids lifting the reticle as the cover 5 is removed from the pod 1.

If the O-ring 39 has become worn, it can be rotated on the head 43 of the screw 41 to present a fresh O-ring surface to the reticle R. If O-ring wear has been severe, damage to the reticle is avoided simply by replacing the O-ring 39 with a new one.

The reticle pod 1 can be used with a conventional SEMI-standard pod opener, which includes a sensor used for detecting whether a reticle R is in the pod 1. The optical axis of the detection sensor usually is above the horizontal center line L (FIG. 1) of the pod. To avoid obstructing the light beam from the sensor, the risers 19b of the reticle-support blocks 19 desirably are displaced from the center line L. FIG. 1 also depicts a line L1, which connects the center of the reticle R with the center of the reticle-support block 19-1. Note that the line L1 is at an angle θ relative to the line L. Desirably, the angle θ is at least 5°, which is sufficient to position the notch-engagement portion 24 away from the optical axis of the sensor to avoid obstruction of a beam of light from the sensor.

Figure 6:
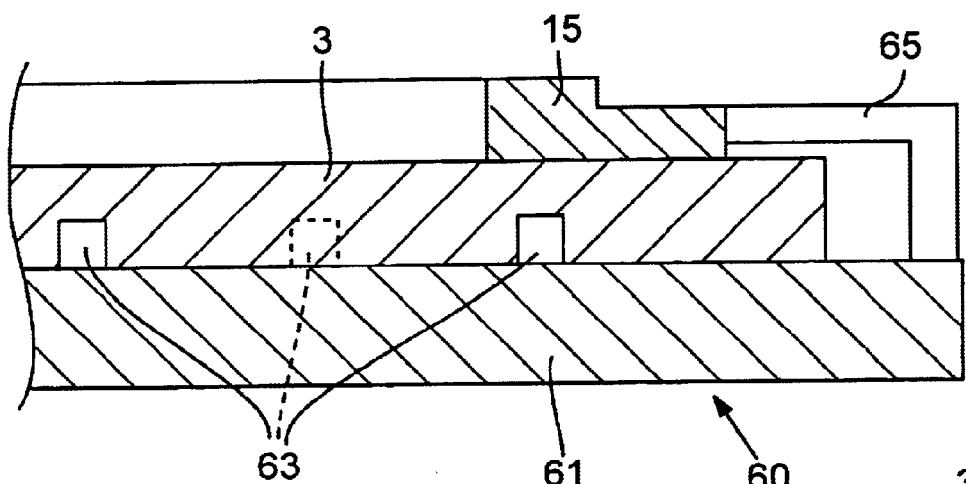
FIG. 6 is a partial elevational section depicting assembly of the ring-shaped member to the base of the reticle pod of FIG. 1, using a positioning jig.

The ring-shaped member 15 is easily mounted to the mounting pads 11 on the base 3. For positioning and attachment to the base 3, the ring-shaped member 15 is mounted in a positioning jig, which positions the ring-shaped member 15 correctly for mounting on the mounting pads 11. Referring to FIG. 6, an embodiment of the positioning jig 60 comprises a pedestal 61 on which the base 3 is placed. Positioning pins 63 project from the pedestal 61, and a positioning arm 65 is mounted to the pedestal 61. The positioning pins 63 position the base 3 properly on the pedestal 61, and the positioning arm 65 positions the ring-shaped member 15 on the base 3.

First, the base 3 is placed on the pedestal 61 and positioned using the positioning pins 63. Next, the ring-shaped member 15 is placed on the mounting pads 11 and positioned using the positioning arm 65. Thus, the ring-shaped member 15 is positioned at the appropriate position relative to the base 3. Then, the thinner portion 15b of the ring-shaped member 15 is secured to the mounting pads 11 using the machine screws 17.

Figure 7:
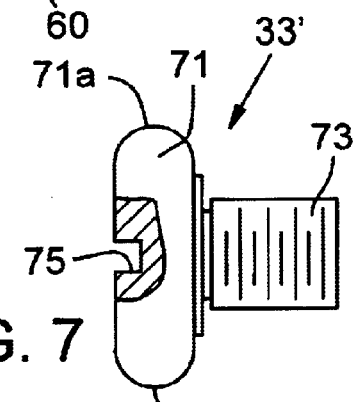
FIG. 7 is an enlargement showing details of an alternative configuration of a reticle-contact member provided on the distal end of a pressure-application member.

The relevant portion of an alternative configuration of the pressure-application member is shown in FIG. 7. Specifically, in this alternative configuration, the contact member 33 of the first representative embodiment is replaced with an alternative contact member 33', in which the head 43 and O-ring 39 of the first representative embodiment is replaced with a head 71 made entirely of compliant material (e.g., inert rubber). The head 71 is attached to or integral with a threaded portion 73, and includes a driver-insertion groove 75 or the like. The outer edge 71a of the head 71 has a semicircular transverse profile.

Figure 8:
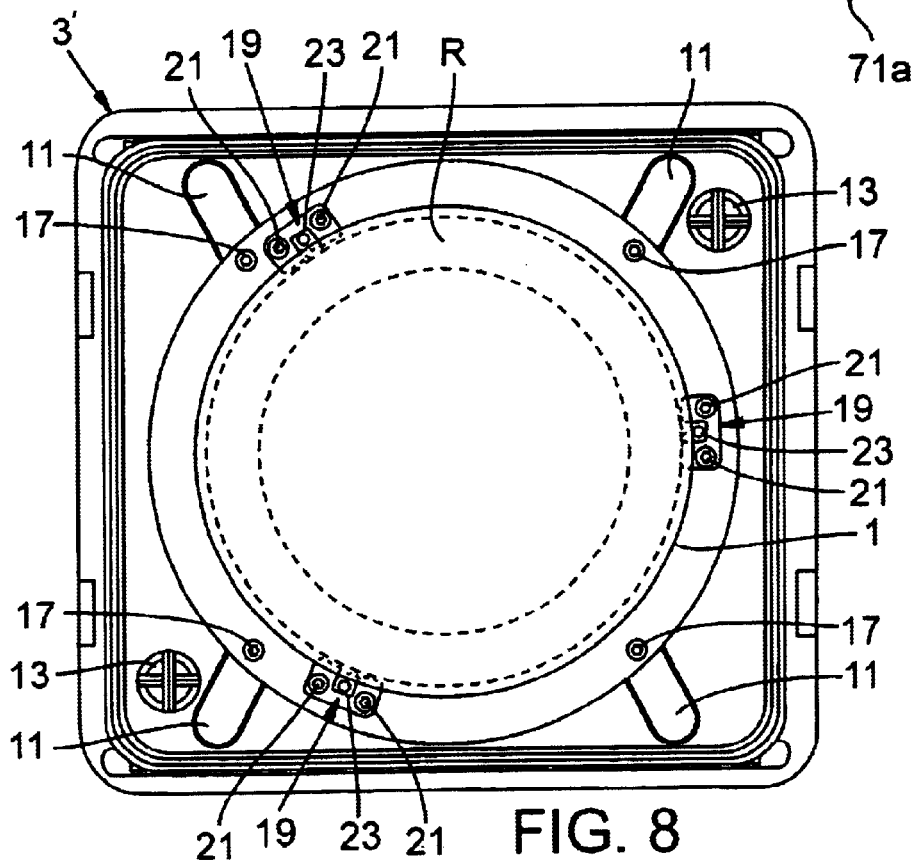
FIG. 8 is a plan view of a reticle pod according to a second representative embodiment.

A reticle pod according to a third representative embodiment is depicted in FIG. 8 that shows a structure that is nearly identical to the pod shown in FIG. 1. In FIG. 8, components that are the same as respective components shown in FIG. 1 have the same respective reference numerals and are not described further. The embodiment of FIG. 8 includes a base 3' to which reticle-support blocks 19 are mounted. All the reticle-support blocks 19 are configured identically in this embodiment. I.e., each reticle-support block 19 is similar to the reticle-support blocks 19-2, 19-3 of the FIG.-1 embodiment, and comprises a base 19a and a riser 19b extending from the base 19a. No notch-engagement portion is provided.

Thus, since the reticle R is not oriented in any particular way inside the pod of the embodiment of FIG. 8, the pod is suitable for instances in which reticle orientation inside the pod is of no consequence.

It will be understood that reticle pods within the scope of the foregoing disclosure can be used with any of various reticle-handling systems. An exemplary reticle-handling system is, of course, a microlithographic-exposure system. A reticle-handling system typically includes a manipulator (usually robotic) for moving and/or placing the reticle.

Figure 9:
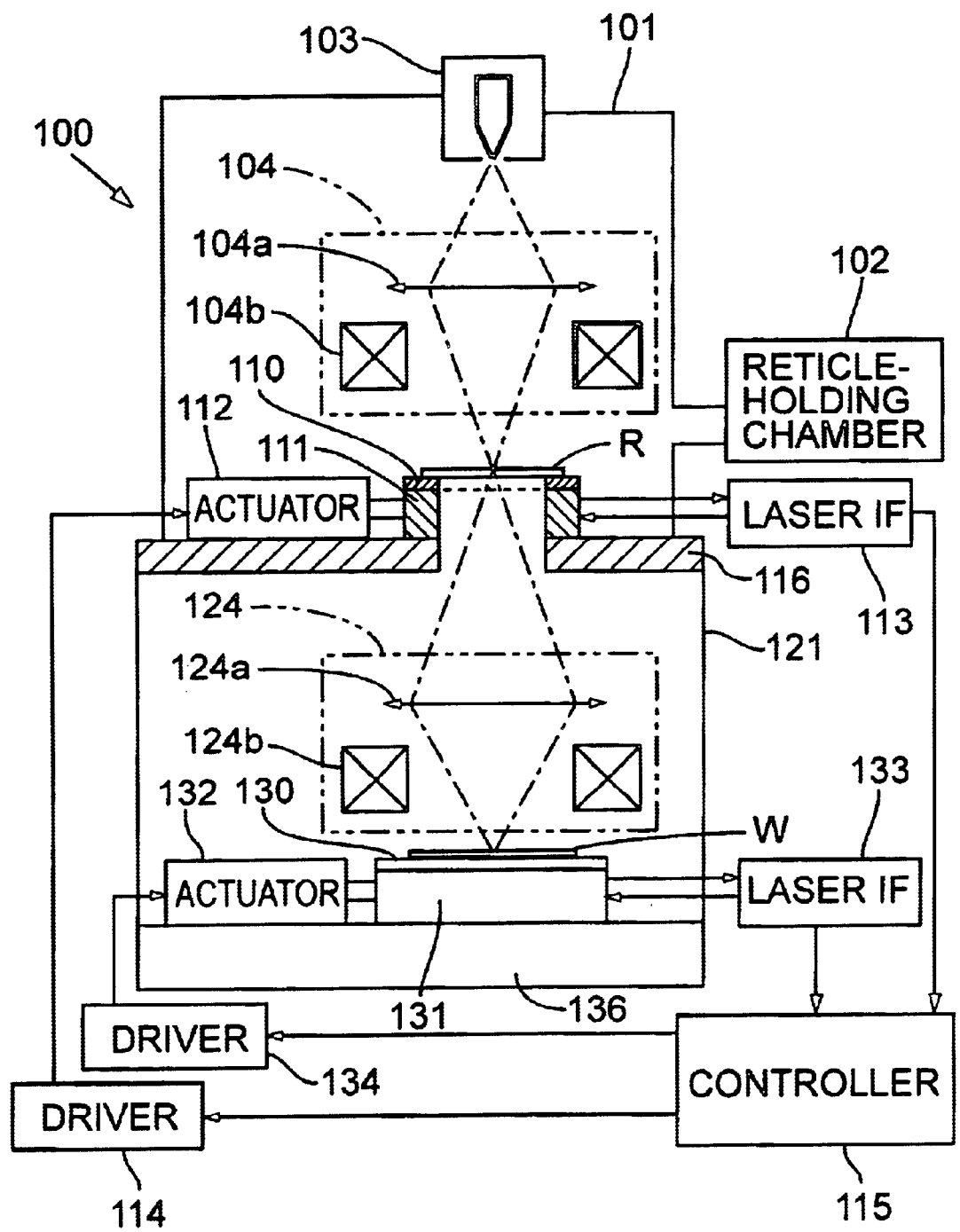
FIG. 9 is a schematic elevational diagram of an exemplary microlithographic-exposure system configured to utilize reticle pods as disclosed herein.

FIG. 9 schematically depicts the configuration of an embodiment of a microlithographic-exposure system configured to utilize a reticle pod according to, for example, any of the embodiments described above. The depicted system 100 comprises an optical column 101 situated at an upstream end of the system. The optical column 101 is essentially a vacuum chamber that is connected to a vacuum pump (not shown) used for evacuating the atmosphere inside the optical column 101. At the extreme upstream end of the optical column is an electron gun 103 that emits an electron beam in a downstream direction. Downstream of the electron gun 103 is an illumination-optical system 104 that comprises a condenser lens 104a and an electron-beam deflector 104b. A reticle R is situated downstream of the illumination-optical system 104.

The electron beam emitted from the electron gun 103 is condensed by the condenser lens 104a. Sequential scanning (in the horizontal direction in the figure) of the beam across the reticle R is achieved by energization of the deflector 104b, which achieves sequential illumination of subfields in the reticle R situated within the optical field of the illumination-optical system 104. It will be understood that the condenser lens 104a is one stage in the illumination-optical system 104, which typically comprises multiple lens stages as well as a beam-trimming diaphragm, a blanking diaphragm, and other components as required.

The reticle R is secured by electrostatic suction or other suitable force to a reticle chuck 110 mounted on the upstream-facing surface of a reticle stage 111. The reticle stage 111 is mounted on a platform 116. Awaiting use for making microlithographic exposures, the reticle R is held in a reticle pod 1, as described above, inside a reticle-accommodation chamber 102 that branches from the optical column 101. To prepare the reticle for use, the cover 5 of the pod 1 is opened by a pod opener, and the reticle is conveyed from the pod 1 to the reticle stage 111 by a robotic reticle manipulator (not shown).

The reticle stage 111 is moved by a reticle-stage actuator 112. Although the reticle-stage actuator 112 is shown at left in the figure, it typically is a linear motor or other suitable actuator that is integrated into the reticle stage 111. The reticle-stage actuator 112 is connected to a controller 115 via a reticle-stage driver 114. A laser interferometer 113 is used for determining the position of the reticle stage 111. The laser interferometer 113 also is connected to the controller 115. Thus, accurate positional data concerning the reticle stage 111, as measured by the laser interferometer 113, are input to the controller 115, which (in response to the positional data) generates and routes commands to the reticle-stage driver 114 to energize the reticle-stage actuator 112 as required to position the reticle stage 111 at a target position. Thus, the position of the reticle stage 111 is controlled accurately in real time.

A wafer chamber 121 (a second vacuum chamber) is situated downstream of the platform 116. The interior of the wafer chamber is evacuated by a vacuum pump (not shown). The wafer chamber 121 contains a projection-optical system 124 (configured as a respective optical column) that includes a projection lens 124a, a deflector 124b, and other components as required. Downstream of the projection-optical system 124 is an exposure-sensitive substrate W (typically a resist-coated semiconductor wafer).

The electron beam that has passed through the reticle R is condensed by the projection lens 124a and deflected by the deflector 124b as required to form an image of the illuminated portion of the reticle R on a prescribed location on the surface of the substrate W. Even though only one projection lens 124a is shown in the figure, the projection-optical system 124 typically includes at least two projection lenses as well as aberration-correction lenses and deflector coils as required.

The substrate W is held (by electrostatic attraction or other suitable force) by a wafer chuck 130 mounted to the upstream-facing surface of a wafer stage 131. The wafer stage 131 is mounted on a platform or base 136.

The wafer stage 131 is moved by a wafer-stage actuator 132. Although the wafer-stage actuator 132 is shown at left in the figure, it typically is a linear motor or other suitable actuator that is integrated into the wafer stage 131. The wafer-stage actuator 132 is connected to the controller 115 via a wafer-stage driver 134. A laser interferometer 133 is used for determining the position of the wafer stage 131. The laser interferometer 133 also is connected to the controller 115. Thus, accurate positional data concerning the wafer stage 131, as measured by the laser interferometer 133, are input to the controller 115, which (in response to the positional data) generates and routes commands to the wafer-stage driver 134 to energize the wafer-stage actuator 132 as required to position the wafer stage 131 at a target position. Thus, the position of the wafer stage 131 is controlled accurately in real time.

Whereas the invention has been described in connection with multiple representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. A pod for holding a circular reticle, comprising:
   a base having a respective interior surface;
   a cover having a respective interior surface and being attached to the base in a manner allowing the cover to open and close relative to the base and to define, cooperatively with the base whenever the cover is closed, an internal space between the respective interior surfaces, the internal space being sized to accommodate the reticle within the internal space;
   three reticle-support blocks mounted to the interior surface of the base, the reticle-support blocks being arranged substantially equi-distantly from each other so as to support the reticle at three respective locations in a tripod manner in a peripheral handling zone on an under-surface of the reticle, each reticle-support block defining a respective reticle-contact surface that contacts the respective location in the handling zone whenever the reticle has been placed on the reticle-support blocks; and
   three compliant reticle-contact members mounted to the interior surface of the cover so as to be positioned, whenever the cover is closed, opposite a respective reticle-contact surface on an upper surface of the reticle, each reticle-contact member being non-adhesive and configured to apply, whenever the cover is closed, a reticle-holding force directed from the reticle-contact member to the respective reticle-contact surface.

2. The pod of claim 1, wherein each reticle-contact member is mounted to a respective pressure-application member mounted to a respective mounting location on the interior surface of the cover.

3. The pod of claim 2, wherein:
   the cover defines more than three mounting locations; and
   the three pressure-application members are mounted to respective mounting locations among the more than three mounting locations provided on the cover.

4. The pod of claim 2, wherein each pressure-application member comprises a flat spring having a proximal end mounted to the respective mounting location on the interior surface of the cover and a distal end to which the respective reticle-contact member is mounted.

5. The pod of claim 4, wherein:
   each flat spring is triangular in profile, with a short side and two long sides;
   the short side is on the proximal end of the flat spring; and
   the respective reticle-contact members are mounted to an intersection of the two long sides.

6. The pod of claim 5, wherein:
   each flat spring has a different size and shape; and
   each flat spring applies a similar magnitude of reticle-holding force, via the respective reticle-contact members, to the respective locations in the handling zone.

7. The pod of claim 6, wherein the reticle-holding forces are normal in direction to the respective reticle-contact surfaces.

8. The pod of claim 1, wherein the reticle-holding forces are normal in direction to the respective reticle-contact surfaces.

9. The pod of claim 1, further comprising a toroidal ring-shaped member mounted to the interior surface of the base, wherein the reticle-support blocks are mounted to the ring-shaped member.

10. The pod of claim 9, wherein the reticle-support blocks are equi-angularly arranged on the ring-shaped member.

11. The pod of claim 9, further comprising at least three mounting pads situated between the ring-shaped member and the interior surface of the base, wherein the mounting pads are mounted to the interior surface of the base and the ring-shaped member is mounted to the mounting pads.

12. The pod of claim 11, wherein the mounting pads are configured to align the ring-shaped member with the base.

13. The pod of claim 1, wherein the reticle-support blocks are arranged so as not to interfere with a sensor used for determining whether a reticle is contained inside the reticle pod.

14. The pod of claim 1, further comprising a reticle aligner situated and configured to align the reticle with respect to the pod whenever the reticle is contained in the pod.

15. The pod of claim 14, wherein:
the reticle aligner comprises a protrusion defined in one of the reticle-support blocks; and
the protrusion is situated and configured to engage an edge notch in the reticle whenever the reticle is being held in the pod.

16. The pod of claim 15, wherein the protrusion is configured to engage a SEMI-standard edge notch.

17. The pod of claim 1, wherein at least two of the reticle-support blocks include, on their respective reticle-contact surfaces, respective stop pins situated and configured to engage an edge of the reticle whenever the reticle is being held in the pod.

18. The pod of claim 17, wherein:
two of the reticle-support blocks include respective stop pins;
a third reticle-support block defines a protrusion; and
the protrusion is situated and configured to engage an edge notch in the reticle whenever the reticle is being held in the pod.

19. The pod of claim 1, wherein each reticle-contact member comprises a respective O-ring that edgewise contacts the respective location in the handling zone.

20. The pod of claim 1, wherein the pressure-application members are selected from the group consisting of spring members and elastomeric members.

21. A pod for holding a circular reticle, comprising:
a base having a respective interior surface;
a cover having a respective interior surface and being attached to the base in a manner allowing the cover to open and close relative to the base and to define, cooperatively with the base whenever the cover is closed, an internal space between the respective interior surfaces, the internal space being sized to accommodate a circular reticle within the internal space; and
three reticle-support blocks mounted to the interior surface of the base, the reticle-support blocks being arranged substantially equi-distantly from each other so as to support the reticle at three respective locations in a tripod manner in a peripheral handling zone on an under-surface of the reticle, each reticle-support block defining a respective reticle-contact surface that contacts the respective location in the handling zone whenever the reticle has been placed on the reticle-support blocks, wherein at least one of the reticle-support blocks comprises a reticle aligner configured to align the reticle with respect to the pod whenever the reticle is contained in the pod.

22. The pod of claim 21, wherein:
the reticle aligner comprises a protrusion defined in one of the reticle-support blocks; and
the protrusion is situated and configured to engage an edge notch in the reticle whenever the reticle is being held in the pod.

23. The pod of claim 22, wherein the protrusion is configured to engage a SEMI-standard edge notch.

24. The pod of claim 21, wherein at least two of the reticle-support blocks include, on their respective reticle-contact surfaces, respective stop pins situated and configured to engage an edge of the reticle whenever the reticle is being held in the pod.

25. The pod of claim 24, wherein:
two of the reticle-support blocks include respective stop pins;
a third reticle-support block defines a protrusion; and
the protrusion is situated and configured to engage an edge notch in the reticle whenever the reticle is being held in the pod.

26. A method for holding a circular reticle having an upper surface, a lower surface, and a peripheral handling zone extending around at least a portion of the circumference of the reticle, the method comprising:
on respective reticle-contact surfaces, supporting the reticle at three locations in the handling zone on the lower surface of the reticle, the locations being substantially an equal distance from one another; and
compliantly imparting, in respective directions normal to the respective reticle-contact surfaces, respective reticle-holding forces at respective locations in the handling zone on the upper surface of the reticle.

27. The method of claim 26, further comprising establishing and maintaining an alignment of the reticle as the reticle is being held.

28. The method of claim 27, wherein the step of establishing and maintaining an alignment of the reticle comprises engaging a protrusion into an edge notch in the reticle.

29. The method of claim 26, wherein the reticle-holding forces are equal in magnitude.

30. The method of claim 26, wherein the reticle-holding forces are parallel to each other.

31. The method of claim 26, further comprising the step of containing the reticle, as the reticle is being held on the reticle-contact surfaces, in a reticle pod serving to isolate the reticle from an external environment.

32. The method of claim 31, further comprising the step of configuring the reticle pod with a base and a cover, wherein the cover is openable relative to the base.

33. The method of claim 32, further comprising the step of aligning the reticle-contact surfaces relative to the base.

34. A microlithography system, comprising:
an optical column configured to receive a circular reticle; and
a reticle pod, comprising (i) a base having a respective interior surface; (ii) a cover having a respective interior surface and being attached to the base in a manner allowing the cover to open and close relative to the base and to define, cooperatively with the base whenever the cover is closed, an internal space between the respective interior surfaces, the internal space being sized to accommodate a circular reticle within the internal space; (iii) three reticle-support blocks mounted to the interior surface of the base, the reticle-support blocks being arranged substantially equi-distantly from each other so as to support the reticle at three respective locations in a tripod manner in a peripheral handling zone on an under-surface of the reticle, each reticle-support block defining a respective reticle-contact surface that contacts the respective location in the handling zone whenever the reticle has been placed on the reticle-support blocks; and (iv) three compliant reticle-contact members mounted to the interior surface of the cover so as to be positioned, whenever the cover is closed, opposite a respective reticle-contact surfaces on an upper surface of the reticle, each reticle-contact member being compliant, non-adhesive, and configured to apply, whenever the cover is closed, a reticle-holding force directed from the reticle-contact member to the respective reticle-contact surface.

35. A microlithography system, comprising:

an optical column configured to receive a circular reticle; and a reticle pod, comprising (i) a base having a respective interior surface, (ii) a cover having a respective interior surface and being attached to the base in a manner allowing the cover to open and close relative to the base and to define, cooperatively with the base whenever the cover is closed, an internal space between the respective interior surfaces, the internal space being sized to accommodate a circular reticle within the internal space; and (iii) three reticle-support blocks mounted to the interior surface of the base, the reticle-support blocks being arranged substantially equi-distantly from each other so as to support the reticle at three respective locations in a tripod manner in a peripheral handling zone on an under-surface of the reticle, each reticle-support block defining a respective reticle-contact surface that contacts the respective location in the handling zone whenever the reticle has been placed on the reticle-support blocks, wherein at least one of the reticle-support blocks comprises a reticle aligner configured to align the reticle with respect to the pod whenever the reticle is contained in the pod.

* * * * *